(12) United States Patent
Zhu

(10) Patent No.: US 12,009,463 B2
(45) Date of Patent: Jun. 11, 2024

(54) DISPLAY SUBSTRATE, METHOD OF MANUFACTURING THE SAME, DISPLAY DEVICE AND DISPLAY PANEL

(71) Applicant: BOE TECHNOLOGY GROUP CO., LTD., Beijing (CN)

(72) Inventor: Xiaoyan Zhu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 563 days.

(21) Appl. No.: 17/280,162

(22) PCT Filed: May 6, 2020

(86) PCT No.: PCT/CN2020/088695
§ 371 (c)(1),
(2) Date: Mar. 25, 2021

(87) PCT Pub. No.: WO2021/223086
PCT Pub. Date: Nov. 11, 2021

(65) Prior Publication Data
US 2023/0136160 A1 May 4, 2023

(51) Int. Cl.
*H01L 33/62* (2010.01)
*H01L 33/00* (2010.01)

(52) U.S. Cl.
CPC ............ *H01L 33/62* (2013.01); *H01L 33/005* (2013.01); *H01L 2933/0066* (2013.01)

(58) Field of Classification Search
CPC .................. H01L 33/62; H01L 33/005; H01L 2933/0066; H01L 27/1218; H01L 27/124;
(Continued)

(56) References Cited

U.S. PATENT DOCUMENTS

2011/0210334 A1* 9/2011 Maekawa ......... H01L 29/41733
257/59
2015/0177876 A1 6/2015 Ishii et al.
(Continued)

FOREIGN PATENT DOCUMENTS

CN 205750219 U 11/2016
CN 107403807 A 11/2017
(Continued)

OTHER PUBLICATIONS

Japanese Patent Office, Office Action Issued in Application No. 2022-523726, Dec. 12, 2023, 16 pages.

*Primary Examiner* — S M Sohel Imtiaz
(74) *Attorney, Agent, or Firm* — McCoy Russell LLP

(57) ABSTRACT

A display substrate includes a base substrate, a first conductive pattern, an organic layer and a second conductive layer. A via hole penetrating the organic layer is arranged in the organic layer along a direction perpendicular to the base substrate, a position of the via hole corresponds to a position of the first conductive pattern, and the second conductive layer is electrically connected to the first conductive pattern through the via hole. The display substrate further includes a filling structure for filling the via hole, a distance difference between a distance from a surface of the filling structure on a side away from the base substrate to the base substrate and a distance from a surface of the organic layer on a side away from the base substrate to the base substrate is smaller than a preset threshold.

14 Claims, 6 Drawing Sheets

(58) Field of Classification Search
CPC ............... H01L 25/167; H01L 27/1237; H01L 27/1262; H01L 27/156
See application file for complete search history.

(56) References Cited

U.S. PATENT DOCUMENTS

| | | | |
|---|---|---|---|
| 2017/0294463 A1* | 10/2017 | Yamazaki | H01L 21/02488 |
| 2017/0338246 A1* | 11/2017 | Kubota | G02F 1/133528 |
| 2018/0204884 A1 | 7/2018 | Isa | |
| 2019/0131377 A1* | 5/2019 | Kwon | H10K 77/10 |
| 2021/0020733 A1 | 1/2021 | Saida et al. | |
| 2022/0359574 A1* | 11/2022 | Lee | H01L 33/005 |

FOREIGN PATENT DOCUMENTS

| | | |
|---|---|---|
| CN | 109728188 A | 5/2019 |
| CN | 109949703 A | 6/2019 |
| JP | 2014016944 A | 1/2014 |
| TW | 201947561 A | 12/2019 |
| WO | 2017013538 A1 | 1/2017 |
| WO | 2019187137 A1 | 10/2019 |

* cited by examiner

DISPLAY SUBSTRATE, METHOD OF MANUFACTURING THE SAME, DISPLAY DEVICE AND DISPLAY PANEL

CROSS REFERENCE TO RELATED APPLICATION

The present application is a U.S. National Phase of International Application No. PCT/CN2020/088695 entitled "DISPLAY SUBSTRATE, METHOD OF MANUFACTURING THE SAME, DISPLAY DEVICE AND DISPLAY PANEL," and filed on May 6, 2020. The entire contents of the above-listed application is hereby incorporated by reference for all purposes.

TECHNICAL FIELD

The present disclosure relates to the field of display technology, and in particular to a display substrate, a method of manufacturing the display substrate, a display device and a display panel.

BACKGROUND AND SUMMARY

As micro light-emitting diode (Micro-LED) technology matures, a Micro-LED is used more and more widely. A Micro-LED display substrate in the related art includes a pixel region and a bonding region, and is bonded with a bonding integrated circuit (IC) in the bonding region to achieve electrical connection. However, during a bonding process, stress concentration may occur, which increases a possibility of that the display substrate is damaged.

In a first aspect, a display substrate is provided in the embodiments of the present disclosure, including: a base substrate; a first conductive pattern on the base substrate; an organic layer on a side of the first conductive pattern away from the base substrate; and a second conductive layer on a side of the organic layer away from the base substrate. The display substrate includes a pixel region and a bonding region, and the first conductive pattern is in the bonding region of the display substrate. A via hole penetrating the organic layer is arranged in the organic layer along a direction perpendicular to the base substrate, a position of the via hole corresponds to a position of the first conductive pattern, and the second conductive layer is electrically connected to the first conductive pattern through the via hole. The display substrate further includes a filling structure for filling the via hole, a distance difference between a distance from a surface of the filling structure on a side away from the base substrate to the base substrate and a distance from a surface of the organic layer on a side away from the base substrate to the base substrate is smaller than a preset threshold.

Optionally, the display substrate further includes a barrier layer on the side of the organic layer away from the base substrate. A region of the barrier layer corresponding to the via hole is located between the filling structure and the second conductive layer.

Optionally, the display substrate further includes a barrier layer on the side of the organic layer away from the base substrate. A region of the barrier layer corresponding to the via hole is located on a side of the filling structure away from the base substrate.

Optionally, the display substrate further includes a buffer layer on a side of the barrier layer away from the base substrate, a distance difference between different regions of the buffer layer and the base substrate is smaller than the preset threshold.

Optionally, the display substrate further includes one or more of a first gate insulation layer, a second gate insulation layer or a dielectric layer on a side of the buffer layer away from the base substrate. A distance difference between different regions of the first gate insulation layer and the base substrate is smaller than the preset threshold, a distance difference between different regions of the second gate insulation layer and the base substrate is smaller than the preset threshold, and a distance difference between different regions of the dielectric layer and the base substrate is smaller than the preset threshold.

In a second aspect, a display panel is provided in the embodiments of the present disclosure, including any one of the above-mentioned display substrate.

In a third aspect, a display device is provided in the embodiments of the present disclosure, including the above-mentioned display panel.

In a fourth aspect, a method of manufacturing a display substrate is provided in the embodiments of the present disclosure, including: providing a base substrate; forming a first conductive pattern on the base substrate; forming an organic layer on a side of the first conductive pattern away from the base substrate; forming a via hole in the organic layer; forming a second conductive layer on a side of the organic layer away from the base substrate, where the second conductive layer is electrically connected to the first conductive pattern through the via hole; and forming a filling structure to fill the via hole, a distance difference between a distance from a surface of the filling structure on a side away from the base substrate to the base substrate and a distance from a surface of the organic layer on a side away from the base substrate to the base substrate is smaller than a preset threshold.

Optionally, subsequent to the forming the filling structure to fill the via hole, the method further includes: forming a barrier layer on a side of the filling structure away from the base substrate.

Optionally, prior to the forming the filling structure to fill the via hole, the method further includes: forming a barrier layer on the side of the organic layer away from the base substrate; and the forming the filling structure to fill the via hole includes: forming the filling structure to fill the via hole on a side of the barrier layer away from the base substrate.

DETAILED DESCRIPTION

Hereinafter, the technical solutions in embodiments of the present disclosure are described clearly and completely in conjunction with drawings in the embodiments of the present disclosure. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

A display substrate is provided according to at least one embodiments of the present disclosure.

Figure 1A:
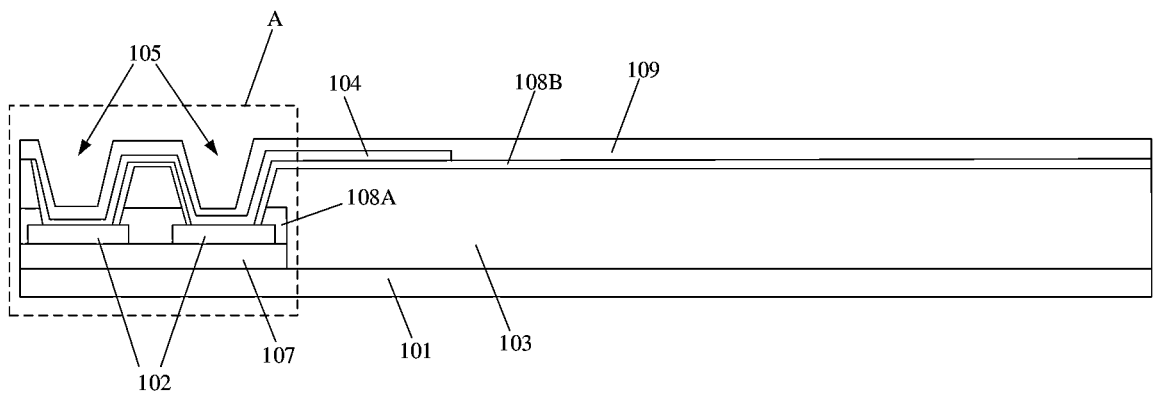
FIG. 1A is one structural schematic diagram of a display substrate according to at least one embodiment of the present disclosure.
Figure 1B:
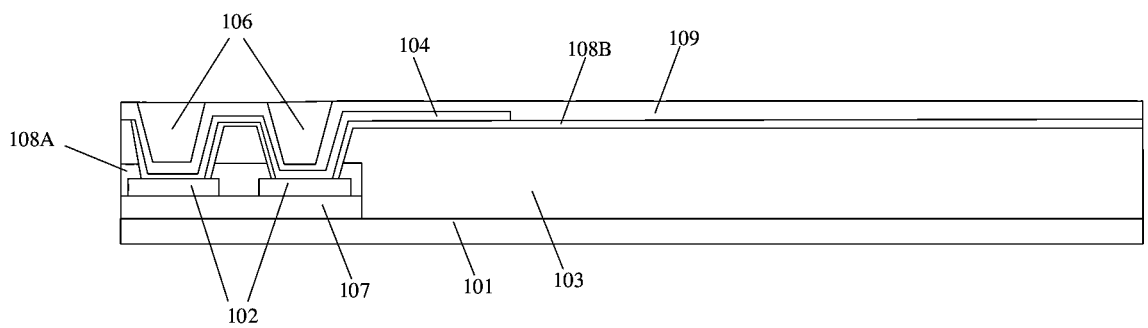
FIG. 1B is another structural schematic diagram of the display substrate according to at least one embodiment of the present disclosure.

As shown in FIGS. 1A and 1B, the display substrate includes a base substrate 101, a first conductive pattern 102 on the base substrate 101, an organic layer 103 on a side of the first conductive pattern 102 away from the base substrate 101; and a second conductive layer 104 on a side of the organic layer 103 away from the base substrate 101.

The display substrate includes a pixel region and a bonding region, and the pixel region includes a plurality of pixels and a driving circuit for providing electrical signals to the plurality of pixels. The bonding region includes a bonding structure (such as a bonding terminal) connected to the driving circuit for bonding an external driving circuit such as a chip on flex (COF) or an integrated circuit (IC).

The first conductive pattern 102 is in the bonding region A as shown in FIG. 1A.

As shown in FIG. 1A, the base substrate 101 is made of a rigid material, such as glass, and the display substrate needs to be peeled off from the base substrate 101 after the display substrate is finished manufacturing. A via hole 105 penetrating the organic layer 103 is arranged in the organic layer 103 along a direction perpendicular to the base substrate 101, a position of the via hole 105 corresponds to a position of the first conductive pattern 102, and the second conductive layer 104 is electrically connected to the first conductive pattern 102 through the via hole 105.

The first conductive pattern 102 is a part of a bonding structure, which is used to realize an electrical connection between the external driving circuit and the driving circuit on the display substrate. The first conductive pattern 102 may be, but not limited to, of a laminated structure of titanium aluminum titanium (Ti/Al/Ti), a thickness of which is controlled at 60 nanometers to 200 nanometers. Or the first conductive pattern 102 may be, but not limited to, of a single layer structure made of copper, a thickness of which is controlled at about 80 nanometers to 150 nanometers.

The organic layer 103 may be made of polyimide (PI), and a thickness of the organic layer 103 is about 6 microns to 20 microns, more specifically, about 6 microns to 10 microns. The organic layer 103 is provided with a via hole 105, and a region of the via hole 105 corresponds to a region where the first conductive pattern 102 is located. Thus, the first conductive pattern 102 is exposed by the via hole 105, and the second conductive layer 104 is electrically connected to the first conductive pattern 102 through the via hole 105. Further, the second conductive layer 104 may be electrically connected to other structures of the display substrate, so as to achieve an electrical connection between the bonding structure electrically connected to the first conductive pattern 102 and the display substrate.

The second conductive layer 104 may be, but not limited to, made of a metal material such as aluminum and copper or a composite material of metal materials, and a thickness thereof is about 60 nanometers to 200 nanometers. The second conductive layer 104 is in electrical contact with the first conductive pattern 102, and wiring of the second conductive layer 104 and wiring of the first conductive pattern 102 are at different layers.

Figure 1C:
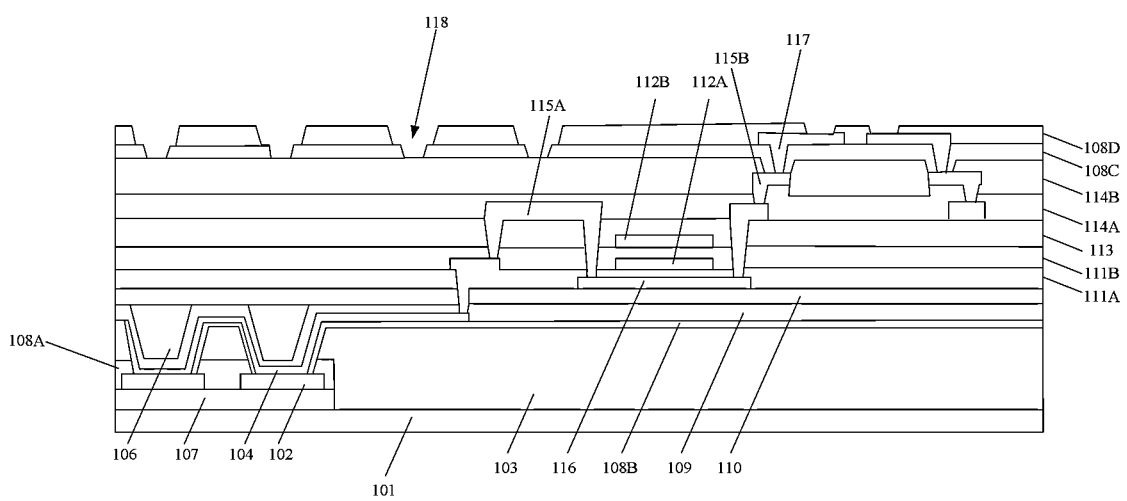
FIG. 1C is yet another structural schematic diagram of the display substrate according to at least one embodiment of the present disclosure.
Figure 1D:
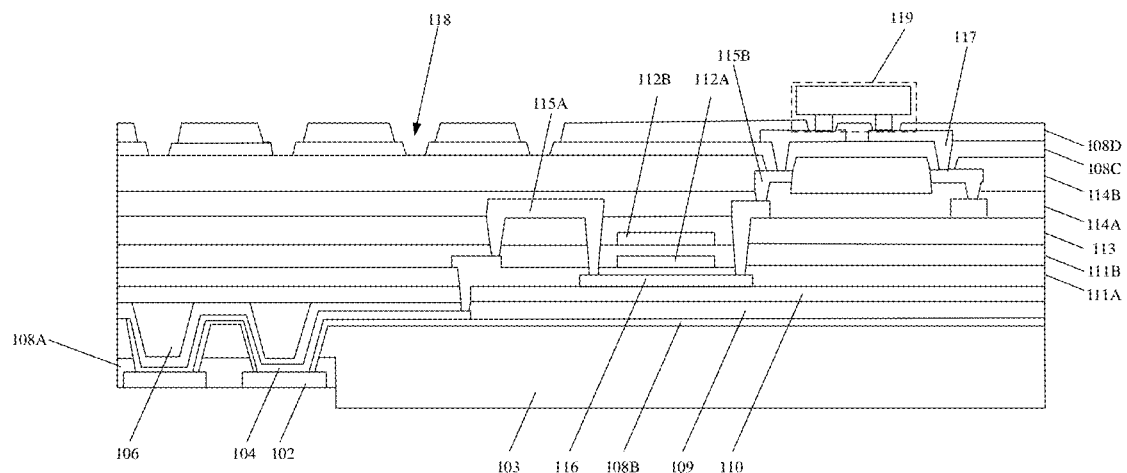
FIG. 1D is still yet another structural schematic diagram of the display substrate according to at least one embodiment of the present disclosure.

As shown in FIG. 1D, after the base substrate 101 in the display substrate is peeled off, a surface of the first conductive pattern 102 close to the base substrate 101 is exposed, and the second conductive layer 104 is shielded by the first conductive pattern 102. Therefore, the second conductive layer 104 may be prevented from contacting the external environment, which helps to reducing a possibility of failure of the second conductive layer 104 due to factors such as corrosion.

As shown in FIG. 1B, the display substrate further includes a filling structure 106 for filling the via hole 105, a distance difference between a distance from a surface of the filling structure 106 on a side away from the base substrate 101 to the base substrate 101 and a distance from a surface of the organic layer 103 on a side away from the base substrate 101 to the base substrate 101 is smaller than a preset threshold.

The filling structure 106 may be made of the same material as the organic layer 103. The distance difference between the distance from the surface of the filling structure 106 on the side away from the base substrate 101 to the base substrate 101 and the distance from the surface of the organic layer 103 on the side away from the base substrate 101 to the base substrate 101 is smaller than the preset threshold, which means that, the distance difference between the distance from the surface of the filling structure 106 on the side away from the base substrate 101 to the base substrate 101 and the distance from the surface of the organic layer 103 on the side away from the base substrate 101 to the base substrate 101 is relatively small in a case that the filling structure 106 is formed.

In an optional and specific embodiment, the preset threshold is not greater than 10% of a thickness of the organic layer 103. For example, in a case that the thickness of the organic layer 103 is 6 microns, the preset threshold is not greater than 600 nanometers. Obviously, in an actual implementation, the smaller the preset threshold value, the better the flatness of a film layer formed subsequently, which helps to further improve the reliability of the display panel.

It should be appreciated that, in a case that the filling structure 106 is not formed, a shape of a part of a film layer located on a side of the via hole 105 away from the base substrate 101 matches a shape of the via hole 105, that is, there is a height difference equivalent to a depth of the via hole 105 in a region where the via hole 105 is located and a region outside the via hole 105. By forming the filling structure 106, the part of the film layer located on the side of the via hole 105 away from the base substrate 101 may be directly disposed on the filling structure, so that the whole film layer is in a relatively flat state.

Compared with the related art, in the display substrate, a method of manufacturing the display substrate, a display device and the display panel according to the embodiments of the present disclosure, the filling structure 106 for filling the via hole 105 is arranged in the via hole 105 of the bonding region A. In this way, the filling structure 106 may realize the sharing of the pressure generated during the bonding process, reducing a possibility of stress concentration at the via hole 105, thereby reducing a possibility of that the display substrate is damaged.

As shown in FIG. 1A and FIG. 1B, the display substrate may further include other film layer structures. For example, it may further include a sacrificial layer (De-Bonding-Layer, DBL) 107, a protective layer, etc. Obviously, these film layer structures are not necessary, and other structural film layers may be added according to practical applications.

In at least one embodiment of the present disclosure, the sacrificial layer 107 is located between the first conductive pattern 102 and the base substrate 101, and may be made of PI-like (polyimide-like) materials, a thickness of which is about 50 nanometers to 150 nanometers. The sacrificial layer 107 is used to separate the first conductive pattern 102 from the base substrate 101, so that the bonding structure is bonded to the display substrate and electrically connected to the first conductive pattern 102.

In at least one embodiment of the present disclosure, the protective layer includes a first protective layer 108A and a second protective layer 108B. The first protective layer 108A is located on a side of the first conductive pattern 102 away from the base substrate 101, and may be made of disilicon dioxide. Generally speaking, a thickness thereof is greater than a thickness of the first conductive pattern 102, specifically, about 100 nanometers to 400 nanometers, so as to protect the first conductive pattern 102 and add the adhesion between the first conductive pattern 102 and the organic layer 103.

The second protective layer 108B is located between the organic layer 103 and the second conductive layer 104 and may be made of silicon nitride. A thickness thereof is about 10 nanometers to 200 nanometers and is mainly used to prevent moisture and oxygen from penetrating into the organic layer 103 and corroding the second conductive layer 104.

Further, in at least one embodiment of the present disclosure, the display substrate further includes a barrier layer 109. The barrier layer 109 may be made of SiNx or silicon oxide (SiOx), and a thickness thereof is about 40 nanometers to 200 nanometers. The barrier layer 109 is mainly used to reduce the adverse effects that may be caused by laser irradiation on a thin film transistor (TFT) structure during a laser lift-off process.

A position of the barrier layer 109 is not fixed.

Optionally, in a specific implementation, the barrier layer 109 is on the side of the organic layer 103 away from the base substrate 101. A region of the barrier layer 109 corresponding to the via hole 105 is located between the filling structure 106 and the second conductive layer 104.

Optionally, in another specific implementation, the barrier layer 109 is on the side of the organic layer 103 away from the base substrate 101. A region of the barrier layer 109 corresponding to the via hole 105 is located on a side of the filling structure 106 away from the base substrate 101.

In other words, the filling structure 106 may be provided on a side of the barrier layer 109 away from the base substrate 101 to fill the via hole 105, or the barrier layer 109 may be formed after the filling structure 106 is provided to fill the via hole 105.

Optionally, the display substrate further includes a buffer layer 110 on the side of the barrier layer 109 away from the base substrate 101, a distance difference between different regions of the buffer layer 110 and the base substrate 101 is smaller than the preset threshold.

The buffer layer 110 is usually an inorganic layer formed of one or more of silicon nitride, or silicon oxide, and a thickness thereof is about 250 nm to 400 nm.

It should be appreciated that, by providing the filling structure 106, a part of the buffer layer 110 corresponding to the via hole 105 is located on the side of the filling structure 106 away from the base substrate 101, so the buffer layer 110 does not include a recessed region adapted to a shape of the via hole 105, but in a substantially flat state. In this way, a distance difference between different regions of the formed buffer layer 110 and the base substrate 101 is relatively small, and the buffer layer 110 is in a relatively flat state.

Optionally, the display substrate further includes one or more of a first gate insulation layer 111A, a second gate insulation layer 111B or a dielectric layer 113 on a side of the buffer layer 109 away from the base substrate. A distance differences between different regions of the first gate insulation layer 111A and the base substrate 101 is smaller than the preset threshold, a distance difference between different regions of the second gate insulation layer 111B and the base substrate 101 is smaller than the preset threshold, and a distance difference between different regions of the dielectric layer 113 and the base substrate 101 is smaller than the preset threshold.

In other words, a side of each of one or more of the first gate insulation layer 111A, the second gate insulation layer 111B, or the dielectric layer 113 away from the base substrate 101 is planarized to form a flat surface.

In the embodiment, the first gate insulation layer 111A and the second gate insulation layer 111B may be made of an insulation material such as silicon nitride or silicon oxide, while the dielectric layer 113 is made of an organic material, with a thickness of about 30 nanometers to 150 nanometers.

Specifically, the first gate insulation layer 111A is located on the side of the barrier layer 109 away from the base substrate 101. In the related art, the first gate insulation layer 111A needs to adapt to the structure of the via hole 105, so a region of the first gate insulation layer 111A corresponding to the via hole 105 needs to adapt to the shape of the via hole 105, and a part thereof is inclined. In the region corresponding to the via hole 105, a distance from the first gate insulation layer 111A to the base substrate is small, and in a region outside the region corresponding to the via hole 105, a distance from the first gate insulation layer 111A to the base substrate is relatively large, and a distance difference is about a depth of the via hole 105.

In the technical solution of the embodiment of the present disclosure, since the filling structure 106 is provided, the filling structure is also provided between the first gate insulation layer 111A and the base substrate 101 in the region corresponding to the via hole 105, so that a distance difference between the different regions of the layer 111A and the base substrate 101 may be significantly reduced.

Specifically, the predetermined threshold is not greater than 600 nanometers, that is, a flatness of the first gate insulation layer 111A, the second gate insulation layer 111B, or the dielectric layer 113 is not greater than 600 nanometers. Further, in a specific implementation, the preset threshold is not greater than 200 nanometers, which may further improve the flatness of each film layer.

Similar to the structure of the buffer layer 110, since the filling structure 106 is provided, structures of other subsequent film layers have also changed accordingly. There is no need to adapt to the shape of the via hole 105, and no part thereof is inclined, so the structures are relatively flat. It may also be understood that distances between different regions of these film layers and the base substrate 101 are relatively uniform, and a distance difference is relatively small.

At the same time, since these film layers are relatively flat, there is no need to form a structure that matches the shape of the via hole 105. Therefore, during formation of these film layers, only material deposition is required, and there is no need to expose the region corresponding to the via hole 105 by using a mask process (a mask exposure), thereby reducing the use of mask.

For example, masks required for forming the first gate insulation layer 111A, the second gate insulation layer 111B, and the dielectric layer 113 may be reduced. In this way, four patterning processes are saved, which helps to saving costs and process flow. At the same time, since exposure, etching and other operations are not required, a possibility of a photoresist (PR) and a metal remaining in the region corresponding to the via hole 105 during a manufacturing process may also be reduced, thereby helping to improving a quality of the display substrate.

Further, as shown in FIGS. 1C and 1D, in a case that the display substrate includes a thin film transistor, the display substrate may further include, but not limited to, such film layers as an active layer 116, a first gate layer 112A, a second gate layer 112B, and a first source-drain electrode 115A, a second source-drain electrode 115B, a first planarization layer 114A, a second planarization layer 114B, a third protective layer 108C, a fourth protective layer 108D and a third conductive layer 117.

The third protective layer 108C and the fourth protective layer 108D are provided with a plurality of vent holes 118 penetrating the third protective layer 108C and the fourth protective layer 108D. It should be appreciated that, the third protective layer 108C and the fourth protective layer 108D are each a dense inorganic layer. By providing the vent holes 118, a possibility of bubbling of these layers in subsequent high temperature process may be reduced.

Further, a pixel unit is formed on a side of the fourth protective layer 108D and the third conductive layer 117 away from the base substrate, and a driving electrode of the pixel unit is electrically connected to the third conductive layer 117. As shown in FIG. 1D, when a pixel in the display substrate is an inorganic light-emitting diode 119, the inorganic light-emitting diode 119 is required to be bonded to the base substrate provided with the driving circuit by means of transfer. A P electrode and an N electrode of the inorganic light-emitting diode 119 are electrically connected to corresponding electrodes of the third conductive layer 117 respectively.

Figure 2A:
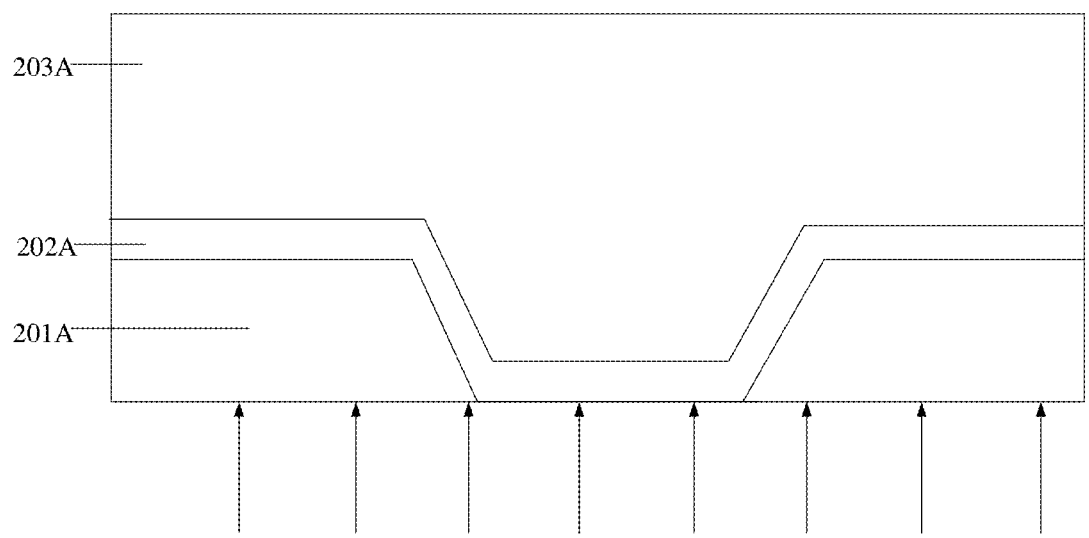
FIG. 2A is a simulation model of a display substrate in the related art.
Figure 2B:
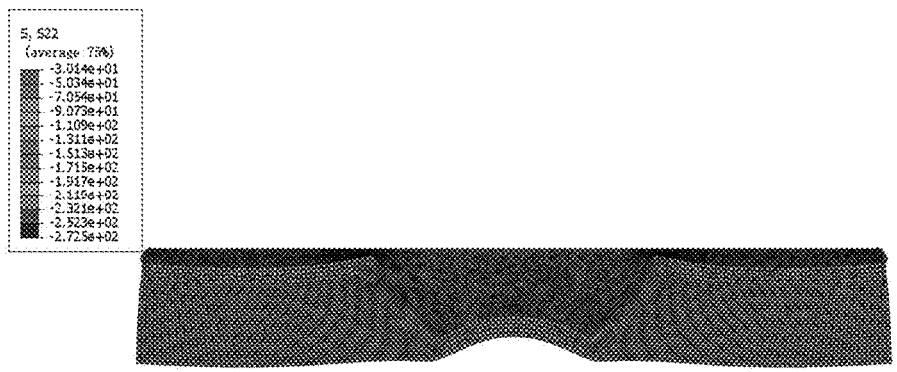
FIG. 2B is a stress simulation result of the display substrate in the related art.
Figure 2C:
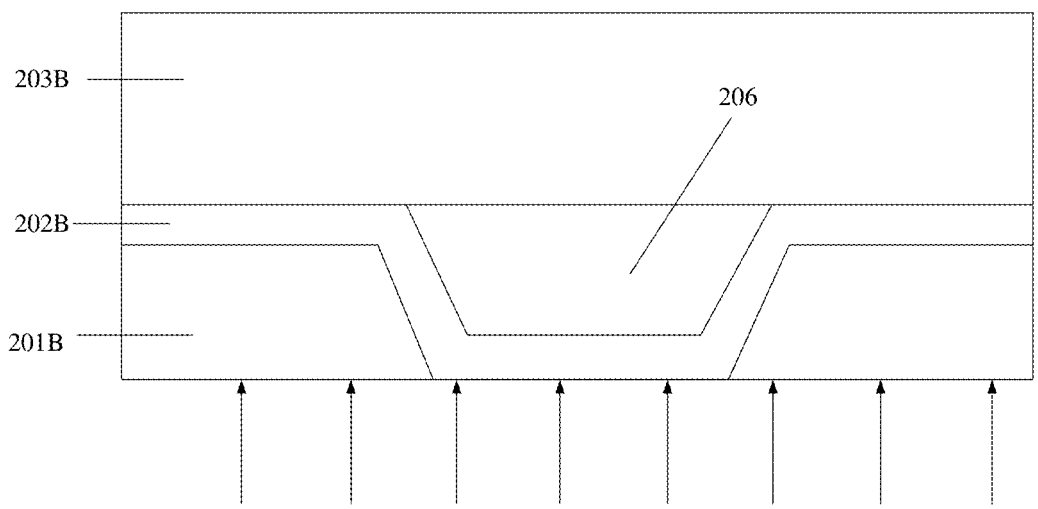
FIG. 2C is a simulation model of the display substrate according to at least one embodiment of the present disclosure.

Please referring to FIG. 2A to FIG. 2D, FIG. 2A is a simulation model of a display substrate in the related art. The simulation model is mainly used to simulate mechanical properties of the display substrate. FIG. 2A shows an organic layer 201A including a via hole, and schematically shows a metal layer 202A disposed in the via hole of the organic layer 201A, and other film layers 203A located on the metal layer 202A. FIG. 2C is a simulation model of the display substrate according to at least one embodiment of the present disclosure, showing an organic layer 201B including a via hole, and schematically showing a metal layer 202B disposed in via hole of the organic layer 201B, a filling structure 206 that is filled in a recessed portion of the metal layer 202B corresponding to a position of the via hole due to the existence of the via hole, and other film layers 203B located on the metal layer 202B and the filling structure 206. The other film layers 203A and 203B of the display substrate refer to a collection of film layer structures on a side of the organic layer 103 away from the base substrate 101 in the display substrate shown in FIG. 1C and FIG. 1D.

In the simulation models shown in FIGS. 2A and 2C, boundary conditions of an upper boundary of the display substrate are set to be U1=0, U2=0, and R12=0, that is, lateral and longitudinal displacements of the upper boundary of the display substrate are both 0, and a rotation is 0. Arrows in the figure represents a load applied to a lower boundary of the display substrate. In a simulation, the applied load is 0.3 megapascals (MPa).

In an actual bonding process, the upper boundary shown in FIG. 2A of the display substrate is fixed. Through the boundary condition simulation of the upper boundary, a bonding pressure head is formed by applying a pressure along a direction of the lower boundary to realize the bonding of the display substrate and the bonding structure, and to finish the above load simulation.

Figure 2D:
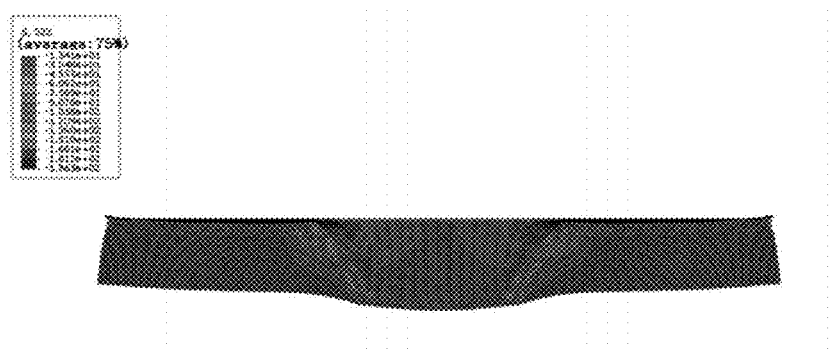
FIG. 2D is a stress simulation result of the display substrate according to at least one embodiment of the present disclosure.

As shown in FIG. 2B and FIG. 2D, a unit is MPa. In a simulation result of the display substrate in the related art shown in FIG. 2B, it may be seen that there is a large stress concentration at the via hole. In a simulation result of the display substrate according to an embodiment of the present disclosure shown in FIG. 2D, the stress concentration at the via hole is significantly reduced.

The display panel according to at least one embodiment of the present disclosure may include the above-mentioned display substrate.

The display device according to at least one embodiment of the present disclosure may include the above-mentioned display panel.

The display device provided by at least one embodiment of the present disclosure may be any product or component with a display function, such as a mobile phone, a tablet computer, a television, a monitor, a notebook computer, a digital photo frame, a navigator, and the like.

Figure 3:
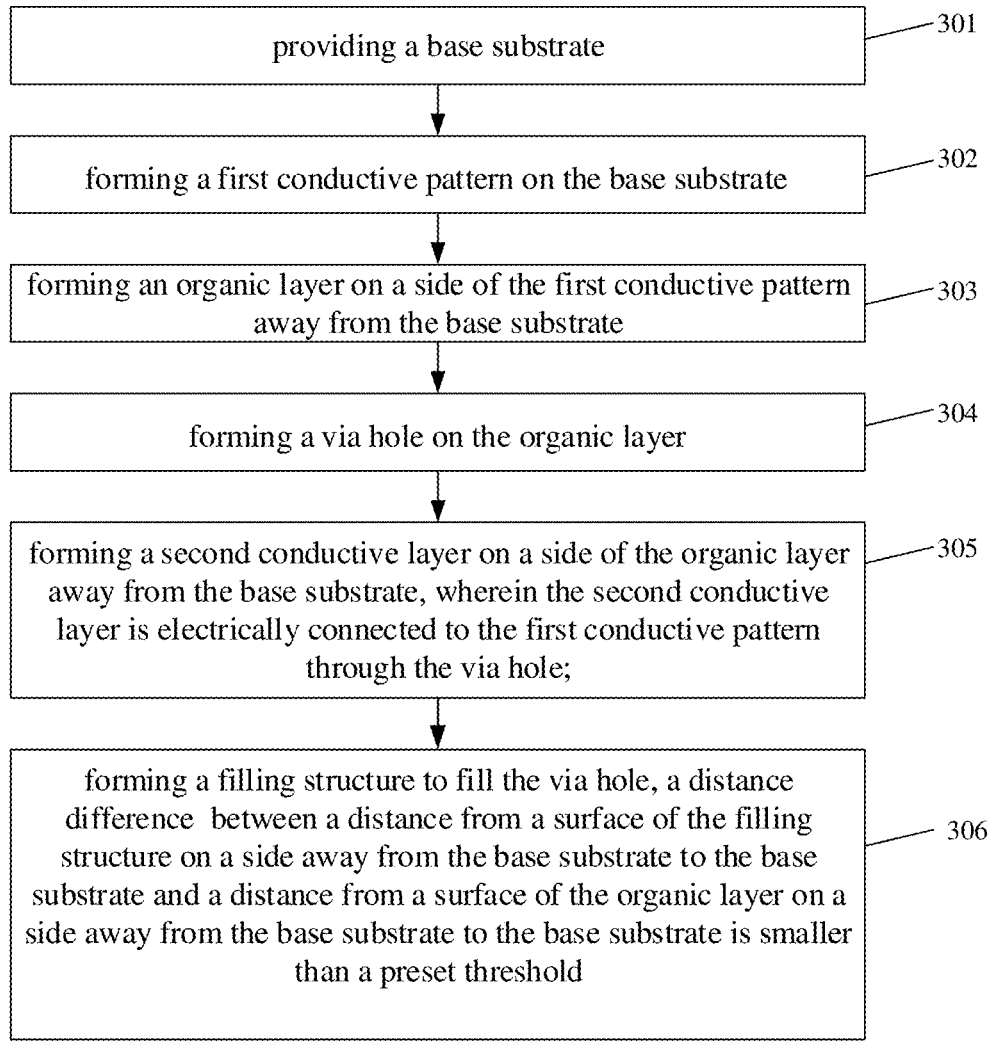
FIG. 3 is a flowchart of a method of manufacturing the display substrate according to at least one embodiment of the present disclosure.

A method of manufacturing a display panel is provided according to embodiments of the present disclosure, as shown in FIG. 3, including the following steps.

Step 301: providing a base substrate.

Figure 4A:
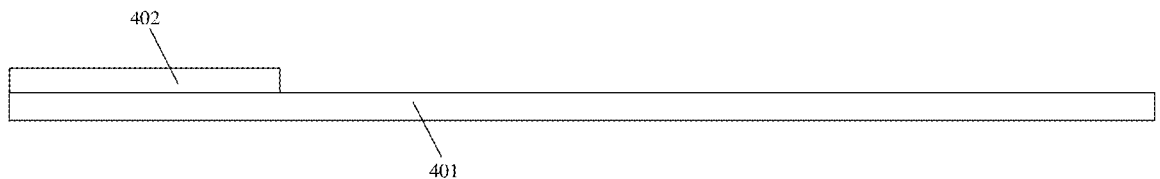
FIG. 4A is a schematic diagram of an intermediate manufacturing process of the display substrate according to at least one embodiment of the present disclosure.

As shown in FIG. 4A, in at least one specific implementation of the present disclosure, a sacrificial layer 402 is first formed on a base substrate 401.

Step 302: forming a first conductive pattern on the base substrate.

Figure 4B:
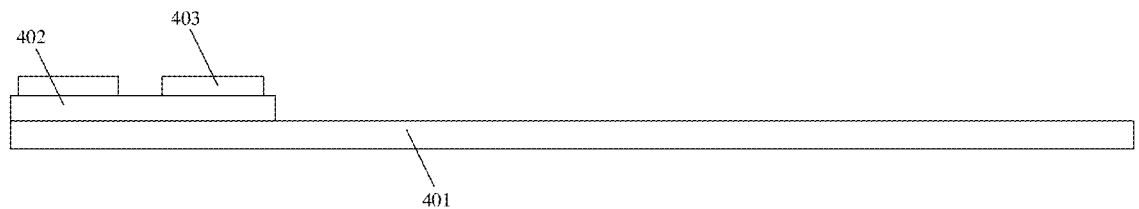
FIG. 4B is another schematic diagram of an intermediate manufacturing process of the display substrate according to at least one embodiment of the present disclosure.

As shown in FIG. 4B, further, a first conductive pattern 403 is formed on the sacrificial layer 402.

Step 303: forming an organic layer on a side of the first conductive pattern away from the base substrate.

Step 304: forming a via hole in the organic layer.

Figure 4C:
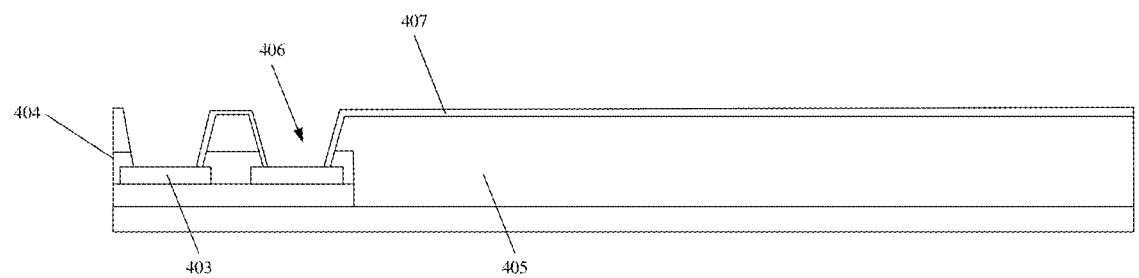
FIG. 4C is yet another schematic diagram of an intermediate manufacturing process of the display substrate according to at least one embodiment of the present disclosure.

As shown in FIG. 4C, firstly, a first protective layer 404 is formed on the first conductive pattern 403, and then an organic layer 405 is formed. Further, a via hole 406 is formed in the organic layer 405, and then a second protective layer 407 is formed.

Step 305: forming a second conductive layer on a side of the organic layer away from the base substrate, where the second conductive layer is electrically connected to the first conductive pattern through the via hole.

Figure 4D:
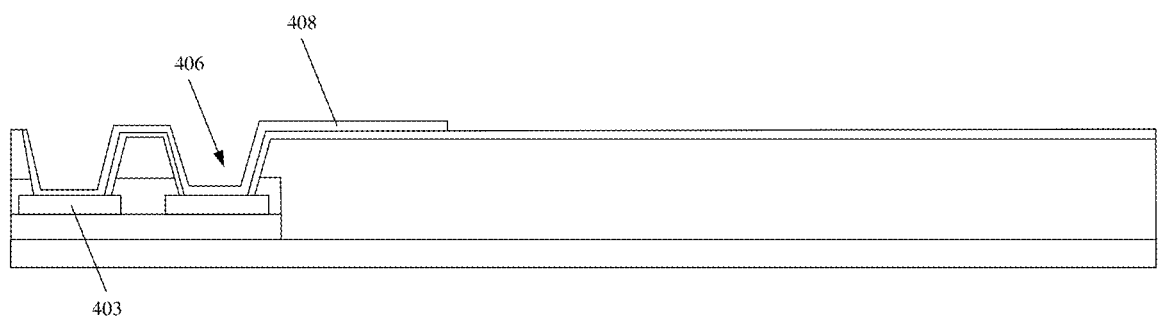
FIG. 4D is still yet another schematic diagram of an intermediate manufacturing process of the display substrate according to at least one embodiment of the present disclosure.

As shown in FIG. 4D, next, a second conductive layer 408 is formed, and the second conductive layer 408 is in electrical contact with the first conductive pattern 403 through the via hole 406.

Step 306: forming a filling structure to fill the via hole, a distance difference between a distance from a surface of the filling structure on a side away from the base substrate to the base substrate and a distance from a surface of the organic layer on a side away from the base substrate to the base substrate is smaller than a preset threshold.

In the embodiment, a process from step 301 to step 305 may refer to the related art.

Figure 4E:
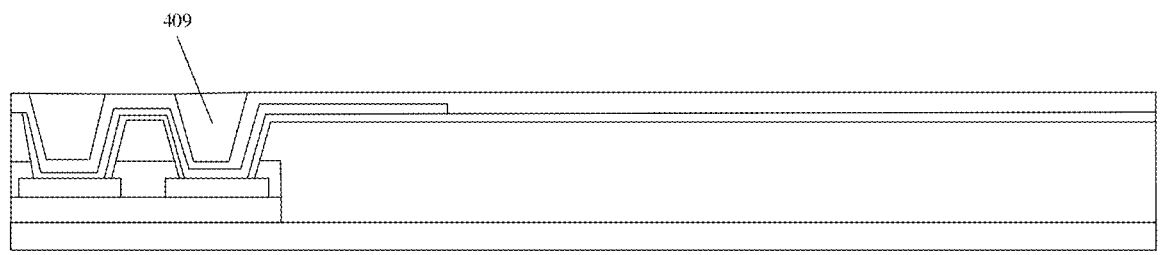
FIG. 4E is still yet another schematic diagram of an intermediate manufacturing process of the display substrate according to at least one embodiment of the present disclosure.

As shown in FIG. 4E, after the second conductive layer 408 is formed, a filling structure 409 is formed to fill the via hole. Specifically, the filling structure 409 may be filled into the via hole by coating or inkjet printing, and be made of high-temperature resistant PI, so as to adapt to some high-temperature processes during manufacturing the display substrate and avoid being damaged during the high-temperature processes.

Since the embodiment may manufacture the display substrate in the above-mentioned display substrate embodiment, it may at least achieve all the technical effects of the above-mentioned display substrate embodiment, which will not be repeated herein.

In at least one embodiment of the present disclosure, the method further includes a step of forming a barrier layer 410. The step may be prior to the step 306 or subsequent to the step 306.

Optionally, in a specific implementation, subsequent to the step 306, the method further includes: forming a barrier layer on a side of the filling structure away from the base substrate.

Optionally, in another specific implementation, prior to the step 306, the method further includes: forming a barrier layer on the side of the organic layer away from the base substrate, and the step 306 specifically includes: forming the filling structure to fill the via hole on a side of the barrier layer away from the base substrate.

Figure 4F:
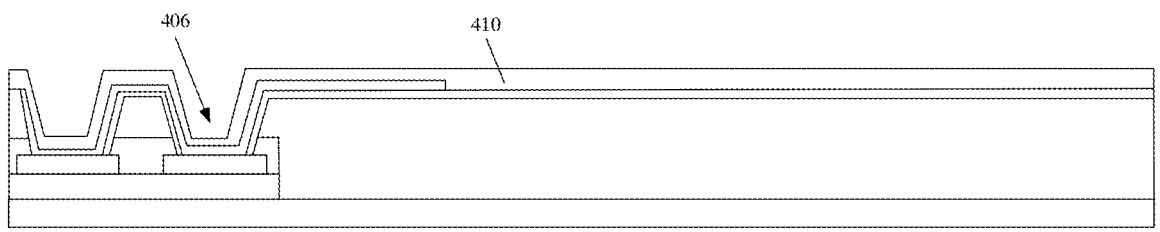
FIG. 4F is still yet another schematic diagram of an intermediate manufacturing process of the display substrate according to at least one embodiment of the present disclosure.

That is to say, as shown in FIG. 4F, the barrier layer 410 may be formed first, as shown in FIG. 4E, and then the filling structure 409 may be formed to fill the via hole; or the filling structure may be formed to fill the via hole first, and then the barrier layer is formed on the side of the filling structure away from the base substrate.

Further, after the barrier layer is formed, the method may further include forming some other structures, for example, including but not limited to, forming a source-drain electrode layer, a planarization layer, a passivation layer, etc., as well as the transfer and bonding of an LED.

The forming processes and materials of other film layer structures may refer to the related art. The transfer of the LED may choose to be a mass transfer or a single transfer. The bonding of the LED may choose to be different manners such as eutectic soldering or conductive glue, and may refer to the related art, which are not further defined and described herein.

It should be noted that, modifications and improvements may be made by a person of ordinary skill in the art without departing from the principle of the present disclosure, and these modifications and improvements shall fall within the scope of the present disclosure.

The invention claimed is:

1. A display substrate, comprising:
   a base substrate;
   a first conductive pattern on the base substrate;
   an organic layer on a side of the first conductive pattern away from the base substrate; and
   a second conductive layer on a side of the organic layer away from the base substrate; wherein
   the display substrate comprises a pixel region and a bonding region, and the first conductive pattern is in the bonding region of the display substrate;
   a via hole penetrating the organic layer is arranged in the organic layer along a direction perpendicular to the base substrate, a position of the via hole corresponds to a position of the first conductive pattern, and the second conductive layer is electrically connected to the first conductive pattern through the via hole;
   the display substrate further comprises a filling structure for filling the via hole, the filling structure is located on a side of the second conductive layer away from the base substrate, an orthogonal projection of the filling structure onto the base substrate is within an orthogonal projection of the via hole onto the base substrate, a distance difference between a distance from a surface of the filling structure on a side away from the base substrate to the base substrate and a distance from a surface of the organic layer on a side away from the base substrate to the base substrate is smaller than a preset threshold.

2. The display substrate according to claim 1, further comprising a barrier layer on the side of the organic layer away from the base substrate, wherein a region of the barrier layer corresponding to the via hole is located between the filling structure and the second conductive layer.

3. The display substrate according to claim 1, further comprising a barrier layer on the side of the organic layer away from the base substrate, wherein a region of the barrier layer corresponding to the via hole is located on a side of the filling structure away from the base substrate.

4. The display substrate according to claim 3, further comprising a buffer layer on a side of the barrier layer away from the base substrate, wherein a distance difference between different regions of the buffer layer and the base substrate is smaller than the preset threshold.

5. The display substrate according to claim 4, further comprising one or more of:
   a first gate insulation layer, a distance difference between different regions of the first gate insulation layer and the base substrate being smaller than the preset threshold;
   a second gate insulation layer, a distance difference between different regions of the second gate insulation layer and the base substrate being smaller than the preset threshold; or
   a dielectric layer on a side of the buffer layer away from the base substrate, a distance difference between different regions of the dielectric layer and the base substrate being smaller than the preset threshold.

6. A display panel, comprising the display substrate according to claim 1.

7. A display device, comprising the display panel according to claim 6.

8. The display panel according to claim 6, wherein the display substrate further comprises a barrier layer on the side of the organic layer away from the base substrate, wherein a region of the barrier layer corresponding to the via hole is located between the filling structure and the second conductive layer.

9. The display panel according to claim 6, wherein the display substrate further comprises a barrier layer on the side of the organic layer away from the base substrate, wherein a region of the barrier layer corresponding to the via hole is located on a side of the filling structure away from the base substrate.

10. The display panel according to claim 9, wherein the display substrate further comprises a buffer layer on a side of the barrier layer away from the base substrate, wherein a distance difference between different regions of the buffer layer and the base substrate is smaller than the preset threshold.

11. The display panel according to claim 10, wherein the display substrate further comprises one or more of:
   a first gate insulation layer, a distance difference between different regions of the first gate insulation layer and the base substrate being smaller than the preset threshold;
   a second gate insulation layer, a distance difference between different regions of the second gate insulation layer and the base substrate being smaller than the preset threshold; or
   a dielectric layer on a side of the buffer layer away from the base substrate, a distance difference between different regions of the dielectric layer and the base substrate being smaller than the preset threshold.

12. A method of manufacturing a display substrate, comprising:
   providing a base substrate;
   forming a first conductive pattern on the base substrate;
   forming an organic layer on a side of the first conductive pattern away from the base substrate;
   forming a via hole in the organic layer;
   forming a second conductive layer on a side of the organic layer away from the base substrate, wherein the second conductive layer is electrically connected to the first conductive pattern through the via hole; and
   forming a filling structure to fill the via hole, wherein the filling structure is located on a side of the second conductive layer away from the base substrate, an orthogonal projection of the filling structure onto the base substrate is within an orthogonal projection of the via hole onto the base substrate, a distance difference between a distance from a surface of the filling structure on a side away from the base substrate to the base substrate and a distance from a surface of the organic layer on a side away from the base substrate to the base substrate is smaller than a preset threshold.

13. The method according to claim 12, wherein subsequent to the forming the filling structure to fill the via hole, the method further comprises:
   forming a barrier layer on a side of the filling structure away from the base substrate.

14. The method according to claim 12, wherein prior to the forming the filling structure to fill the via hole, the method further comprises:
   forming a barrier layer on the side of the organic layer away from the base substrate; and
   the forming the filling structure to fill the via hole comprises:
   forming the filling structure to fill the via hole on a side of the barrier layer away from the base substrate.

* * * * *